(12) United States Patent
Lin (10) Patent No.: US 8,045,951 B2
(45) Date of Patent: Oct. 25, 2011

(54) DUAL-LO MIXER AND RADIO (75) Inventor: Chia-Liang Lin, Union City, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 1331 days.

(21) Appl. No.: 11/382,922

(22) Filed: May 11, 2006

(65) Prior Publication Data

US 2007/0264958 A1    Nov. 15, 2007

(51) Int. Cl.
     *H04B 1/26*        (2006.01)
(52) U.S. Cl. ........ 455/318; 455/313; 455/315; 455/319; 455/333; 455/209
(58) Field of Classification Search .................. 455/313, 455/315, 318, 319, 333, 209
See application file for complete search history.

(56) References Cited

U.S. PATENT DOCUMENTS

| | | | | |
|---|---|---|---|---|
| 4,380,828 A * | 4/1983 | Moon | ............................. | 455/319 |
| 4,399,439 A * | 8/1983 | Upadhyayula | ............. | 340/14.63 |
| 5,060,298 A * | 10/1991 | Waugh et al. | .................. | 455/326 |
| 5,241,561 A * | 8/1993 | Barnard | ........................ | 375/147 |
| 5,391,938 A * | 2/1995 | Hatsuda | .......................... | 327/71 |
| 6,728,528 B1 * | 4/2004 | Loke | ............................. | 455/318 |
| 7,262,815 B2 | 8/2007 | Su | | |
| 2003/0119474 A1 | 6/2003 | Kimura | | |
| 2005/0118979 A1 | 6/2005 | Langenberg | | |
| 2006/0040634 A1 * | 2/2006 | Wang | ............................. | 455/313 |
| 2006/0052078 A1 | 3/2006 | Ducasse | | |

FOREIGN PATENT DOCUMENTS

| | | |
|---|---|---|
| CN | 1625053 | 6/2005 |
| CN | 1625053 A | 6/2005 |
| EP | 1 175 008 A2 | 1/2002 |
| TW | 291809 | 11/1993 |

OTHER PUBLICATIONS

Nguyen, Trung-Kien IEEE Transactions on Microwave Theory and Techniques, vol. 54, No. 2, Feb. 2006.*
English language translation of abstract of TW 291809.

* cited by examiner

*Primary Examiner* — Lana N Le
*Assistant Examiner* — Hsin-Chun Liao
(74) *Attorney, Agent, or Firm* — Thomas, Kayden, Horstemeyer & Risley, LLP (57) ABSTRACT

A dual-LO mixer is disclosed. The dual-LO mixer receives an input signal, a first reference signal of a first reference frequency, and a second reference signal of a second reference frequency, and performs a frequency translation to convert the input signal into an output signal, wherein the frequency difference between the input signal and the output signal is a sum or a difference of the first reference frequency and the second reference frequency.

3 Claims, 6 Drawing Sheets

DUAL-LO MIXER AND RADIO

BACKGROUND OF THE INVENTION

1. Field of the Invention

The present invention relates to mixer circuit and its application to radio system, in particular to mixer performing two-step frequency translation and radio system employing such mixer.

2. Description of Related Art

In a radio receiver, a receiving mixer receives two input signals, i.e. a RF (radio frequency) signal and a LO (local oscillator) signal, and generates an output signal, i.e. an IF (intermediate frequency) signal, whose frequency is a difference between a frequency of the RF signal and a frequency of the LO signal. Conversely, in a radio transmitter, a transmitting mixer receives two input signals, i.e. an IF signal and a LO signal, and generates an output signal, i.e. a RF signal, whose frequency is a sum of a frequency of the IF signal and a frequency of the LO signal. In either case, a mixer performs a frequency translation but at the same time also introduces noise and distortion to the desired output signal (the IF signal in a receiving mixer or the RF signal in a transmitting signal). Two types of mixers are commonly used in a radio system: active mixer and passive mixer. An active mixer, which needs a constant bias, can provide a gain to the desired output signal but usually is noisy and has poor linearity. On the other hand, a passive mixer, which does not need a constant bias, causes a loss to the desired output signal but usually is less noisy and has good linearity.

Figure 1:
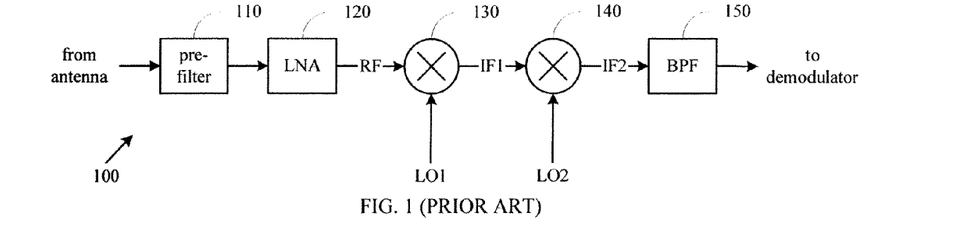
FIG. 1 shows a block diagram of a prior art tuner.

A tuner is an apparatus used to select a particular channel of a narrow-band RF signal amongst a wide-band RF signal comprising a plurality of channels. A tuner needs to utilize a combination of various amplifiers, filters, and mixers to perform the desired channel selection. Rotzoll disclosed a highly integrated TV tuner in U.S. Pat. No. 5,737,035, as illustrated in FIG. 1. In tuner 100 of FIG. 1, a wide-band RF signal is received from an antenna, then filtered by a pre-filter 110, then amplified by a LNA (low-noise amplifier) 120, then converted to a first IF signal by a first mixer 130 using a first LO signal LO1, then converted to a second IF signal by a second mixer 140 using a second LO signal LO2, and then filtered by a BPF (band-pass filter) 150, resulting in a narrow band signal to be further processed by a subsequent demodulator. The performance of tuner 100 is highly limited, due to using two mixers 130 and 140, which either introduces significant noise and distortion (for using an active mixer) or loss (for using a passive mixer) to the desired narrow-band output signal.

What is needed is a method for reducing the noise and distortion or loss caused by using two mixers while still achieving the desired frequency translation.

BRIEF SUMMARY OF THIS INVENTION

In an embodiment, a dual-LO mixer is disclosed, the dual-LO mixer receiving an input signal, a first reference signal of a first reference frequency, and a second reference signal of a second reference frequency, and performing a frequency translation to convert the input signal into an output signal, wherein the frequency difference between the input signal and the output signal is a sum or a difference of the first reference frequency and the second reference frequency.

In an embodiment, a receiver receiving an input signal and at least two reference signals and generating a conversion output signal is disclosed, the receiver comprising: an amplifier for amplifying the input signal, at least one mixer for receiving the amplified input signal and two of said reference signals and performing a frequency translation to generate the conversion output signal, wherein the frequency difference between the conversion output signal and the amplified input signal is a sum or a difference of the frequencies of the two reference signals.

In an embodiment, a receiver is disclosed, the receiver comprising: a first mixer for converting an input RF (radio frequency) signal into a first conversion signal using a first reference signal of a first reference frequency and a second reference signal of a second reference frequency, a second mixer for converting the input RF signal into a second conversion signal using a third reference signal of the first reference frequency and a fourth reference signal of the second reference frequency, a third mixer for converting the input RF signal into a third conversion signal using the first reference signal of the first reference frequency and the fourth reference signal of the second reference frequency, a fourth mixer for converting the input RF signal into a fourth conversion signal using the third reference signal of the first reference frequency and the second reference signal of the second reference frequency, a first summing circuit for summing the first and the second conversion signals to generate a first output signal, and a second summing circuit for summing the third and the fourth conversion signals to generate a second output signal.

In an embodiment, a receiver is disclosed, the receiver comprising: a first mixer for converting an input RF (radio frequency) signal into a first conversion signal using a first reference signal of a first reference frequency and a second reference signal of a second reference frequency, and a second mixer for converting the input RF signal into a second conversion signal using the first reference signal of the first reference frequency and a third reference signal of the second reference frequency.

In an embodiment, a transmitter is disclosed, the transmitter comprising: a first mixer for converting a first baseband input signal into a first conversion signal using a first reference signal of a first reference frequency and a second reference signal of a second reference frequency, a second mixer for converting the first baseband signal into a second conversion signal using a third reference signal of the first reference frequency and a fourth reference signal of the second reference frequency, a third mixer for converting a second baseband signal into a third conversion signal using the first reference signal of the first reference frequency and the fourth reference signal of the second reference frequency, a fourth mixer for converting the second baseband signal into a fourth conversion signal using the third reference signal of the first reference frequency and the second reference signal of the second reference frequency, and a summing circuit for summing the first, the second, the third, and the fourth conversion signals into a RF (radio frequency) signal.

In an embodiment, a mixer is disclosed, a mixer, which has a first, a second input and a third inputs for respectively receiving an input signal, a first reference signal of a first reference frequency, and a second reference signal of a second reference frequency, performing a frequency translation to convert the input signal into an output signal, wherein the frequency difference between the input signal and the output signal is a sum or a difference of the first reference frequency and the second reference frequency.

DETAILED DESCRIPTION OF THIS INVENTION

The present invention relates to a method and apparatus for performing two-step frequency translation using one mixer circuit. While the specifications described several example embodiments of the invention considered best modes of practicing the invention, it should be understood that the invention can be implemented in many way and is not limited to the particular examples described below or to the particular manner in which any features of such examples are implemented. In other instances, well-known details are not shown or described to avoid obscuring aspects of the invention.

In an embodiment, a receiving dual-LO mixer receives three input signals, i.e. a RF (radio frequency) signal, a first LO (local oscillator) signal, and a second LO signal, and generates an output signal, i.e. an IF (intermediate frequency) signal. The receiving mixer can be implemented either as a passive circuit or an active circuit. In a preferred embodiment, an XNOR-SW (exclusive NOR switch) is used to receive the two LO signals.

Figure 2:
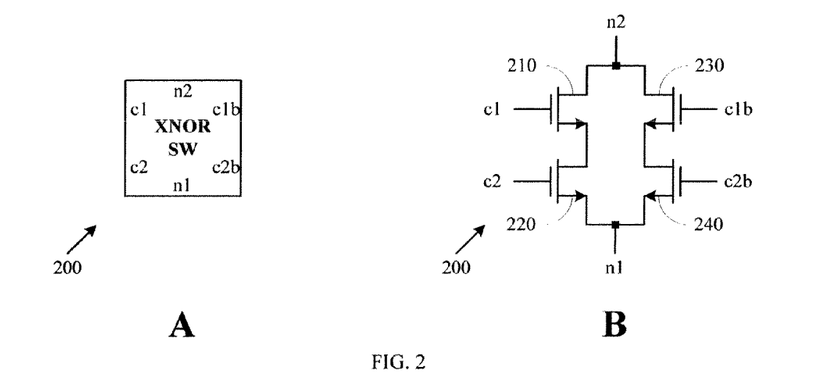
FIG. 2 shows a symbol (in A) and an exemplary circuit embodiment (in B) of an XNOR-SW (exclusive NOR switch) circuit.

An XNOR-SW is a switch that conditionally connects two circuit nodes depending on an exclusive NOR operation on two logical signals. As shown in FIG. 2A, an XNOR-SW circuit 200 has six terminals: n1, n2, c1, c2, c1b, and c2b. Among them, n1 is a terminal for connecting to a first circuit node, n2 is a terminal for connecting to a second circuit node, c1 is a terminal for connecting to a first logical signal, c1b is a terminal for connecting to a logical inversion of the first logical signal, c2 is a terminal for connecting to a second logical signal, and c2 is a terminal for connecting to a logical inversion of the first logical signal. Whenever the first logical signal is in the same state as the second logical signal, the first circuit node will be connected to the second circuit node; otherwise, the first circuit node will be disconnected from the second circuit node. FIG. 2B shows an exemplary circuit embodiment of XNOR-SW 200 using four MOSFET (metal-oxide semiconductor field effect transistors) 210, 220, 230, and 240. When both voltages at c1 and c2 are high (and therefore both voltages at c1b and c2b are low), circuit node n2 is effectively connected to circuit node n1 through transistors 210 and 220. When both voltages at c1 and c2 are low (and therefore both voltages at c1b and c2b are high), circuit node n2 is effectively connected to circuit node n1 through transistors 230 and 240. When c1 and c2 are opposite in voltage level logically (and therefore c1b and c2b are also opposite in voltage level logically), circuit node n2 is effectively disconnected from circuit node n1. Since the connectivity between circuit nodes n1 and n2 is determined by the XNOR operation, which detects whether or not the two logical signals are in the same state, it is referred to as an XNOR-SW circuit. In a further embodiment, transistors 210 and 220 are combined into a first dual-gate MOSFET, and also transistors 230 and 240 are combined into a second dual-gate MOSFET.

Figure 3:
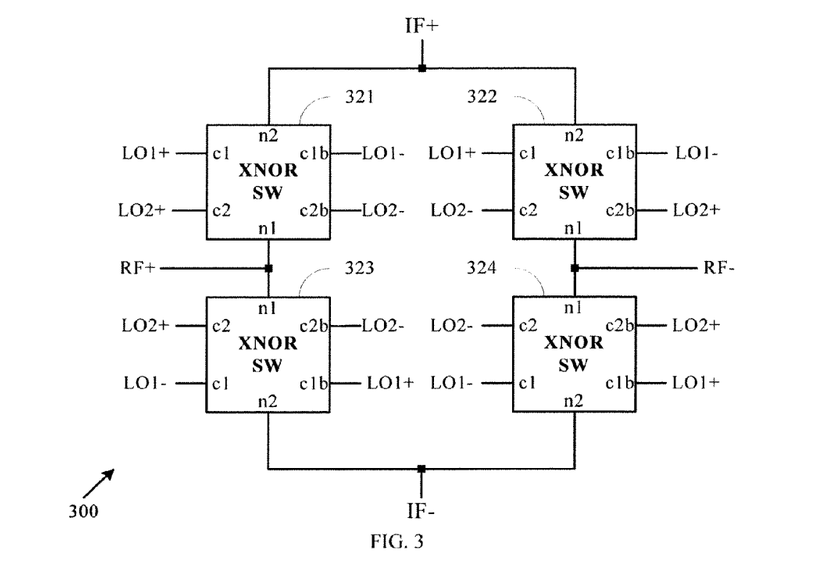
FIG. 3 shows a passive doubly balanced dual-LO mixer using four XNOR-SW circuits.

An exemplary embodiment of a passive, doubly balanced dual-LO mixer 300 using four XNOR-SW circuits is depicted in FIG. 3. Here, dual-LO mixer 300 receives a differential RF signal RF+/−, a first differential LO signal LO1+/−, and a second differential LO signal LO2+/−, and generates a differential IF signal IF+/−. Note that both LO1+/− and LO2+/− are logical signals that have two possible states. In a first state, LO1+(LO2+) is logically high and LO1−(LO2−) is logically low. In a second state, LO1+(LO2+) is logically low and LO1−(LO2−) is logically high. RF+ connects with IF+ through a first XNOR-SW circuit 321; a connectivity is established when LO1+ and LO2+ are in the same logical state (i.e. both logically high or logically low). RF− connects with IF+ through a second XNOR-SW circuit 322; a connectivity is established when LO1+ and LO2− are in the same logical state (and therefore LO1+ and LO2+ are in the opposite logical state). RF+ connects with IF− through a third XNOR-SW circuit 323; a connectivity is established when LO1+ and LO2− are in the same logical state (and therefore LO1+ and LO2+ are in the opposite logical state). RF− connects with IF− through a fourth XNOR-SW circuit 324; a connectivity is established when LO1+ and LO2+ are in the same logical state. In summary, whenever LO1+/− is in the same logical state as LO2+/−, RF+ is effectively connected to IF+, and RF− is effectively connected to IF−; otherwise, RF+ is effectively connected to IF−, and RF− is effectively connected to IF+. The function of mixer 300 is therefore similar to a prior art passive mixer, except that the connectivity between RF+/− and IF+/− is now determined by an XNOR operation on two LO signals, instead of being directly determined by a single LO signal as in a prior art mixer. The XNOR operation on two logical signals is effectively a multiplication (since logical high can be represented by +1 and logical low can be represented by −1). Therefore, a dual-LO mixer 300 performs a two-step frequency translation function, which needs to be implemented by using two mixers (130 and 140 of FIG. 1) in the prior art. Since only one mixer is used, one introduces less loss to the resulting output signal (compared to the case of using two passive mixers in the prior art).

Figure 4:
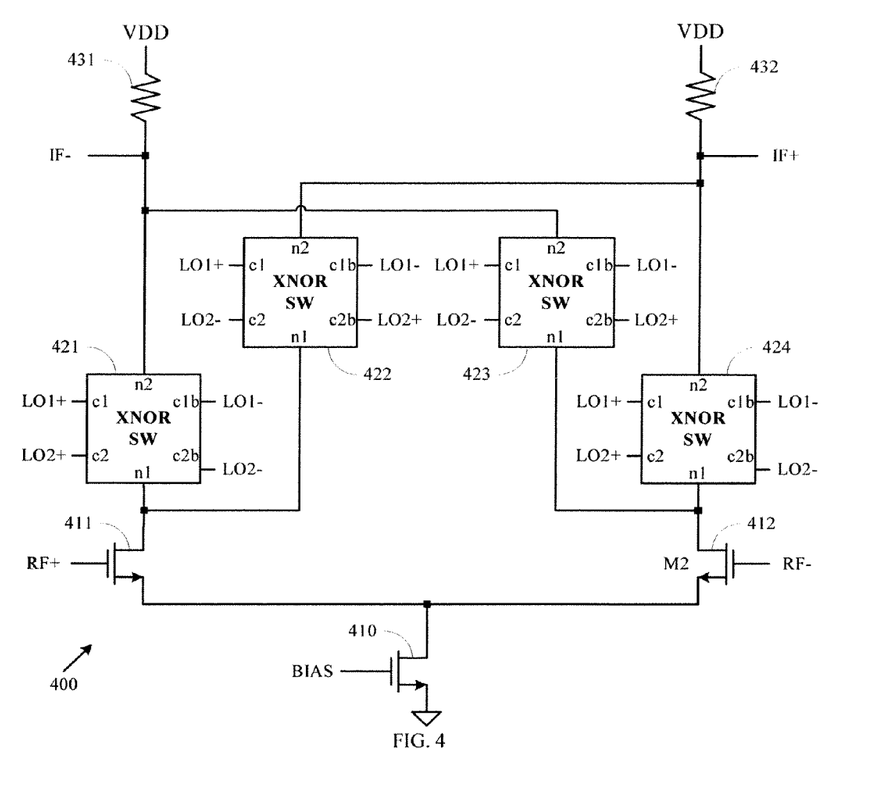
FIG. 4 shows an active doubly balanced dual-LO mixer using four XNOR-SW circuits.

An exemplary embodiment of an active, doubly balanced dual-LO mixer 400 using four XNOR-SW circuits is depicted in FIG. 4. Throughout this disclosure, VDD denotes a supply voltage. In FIG. 4, dual-LO mixer 400 receives a different RF signal RF+/−, a first differential LO signal LO1+/−, and a second differential LO signal LO2+/−, and generates a differential IF signal IF+/−. MOSFET 411 and 412 forms a differential pair to receive and amplify the differential RF signal RF+/−, resulting in the output differential signal IF+/−. The differential pair is biased using a biasing MOSFET 410 with a biasing voltage BIAS. A resistor pair 431 and 432 forms a load to the differential pair to convert a current output (from the differential pair) into a voltage output. The drain of MOSFET 411 is connected to IF− via a first XNOR-SW 421, and also connected to IF+ via a second XNOR-SW 422. The drain of MOSFET 412 is connected to IF− via a third XNOR- SW 423, and also connected to IF+ via a fourth XNOR-SW 424. XNOR-SW 421 and 424 are turned on when LO1+ is in the same logical state as LO2+, and turned off otherwise. XNOR-SW 422 and 423 are turned on when LO1+ is in a logical state opposite to LO2+, and turned off otherwise. When LO1+ is in the same logical state as LO2+, the drain of MOSFET 411 is effectively connected to resistor 431 and the drain of MOSFET 412 is effectively connected to resistor 432. When LO1+ is in a logical state opposite to LO2+, the drain of MOSFET 411 is effectively connected to resistor 432 and the drain of MOSFET 412 is effectively connected to resistor 431. The function of mixer 400 is therefore similar to a prior art active mixer, except that the connectivity between RF+/− and IF+/− is now determined by an XNOR operation on two LO signals, instead of being directly determined by a single LO signal as in a prior art mixer. The XNOR operation on two logical signals is effectively a multiplication (since logical high can be represented by +1 and logical low can be represented by −1). Therefore, dual-LO mixer 400 performs a two-step frequency translation function, which needs to be implemented by using two mixers (130 and 140 of FIG. 1) in the prior art. Since only one mixer is used, one introduces less noise and distortion to the resulting output signal (compared to the case of using two active mixers in the prior art).

Still refer to FIG. 4. In an alternative embodiment, the biasing MOSFET 410 is removed and one connects both the source of MOSFET 411 and the source of MOSFET 412 to ground.

Still refer to FIG. 4. In an alternative embodiment, a MOSFET pair replaces resistor pair 431 and 432.

Throughout this disclosure, any MOSFET device can be replaced by another type of transistor (e.g. bipolar transistor, hetero-junction bipolar transistor, metal-semiconductor field effect transistor, high electron-mobility transistor, and so on) without departing from the principle of this present invention.

Figure 5:
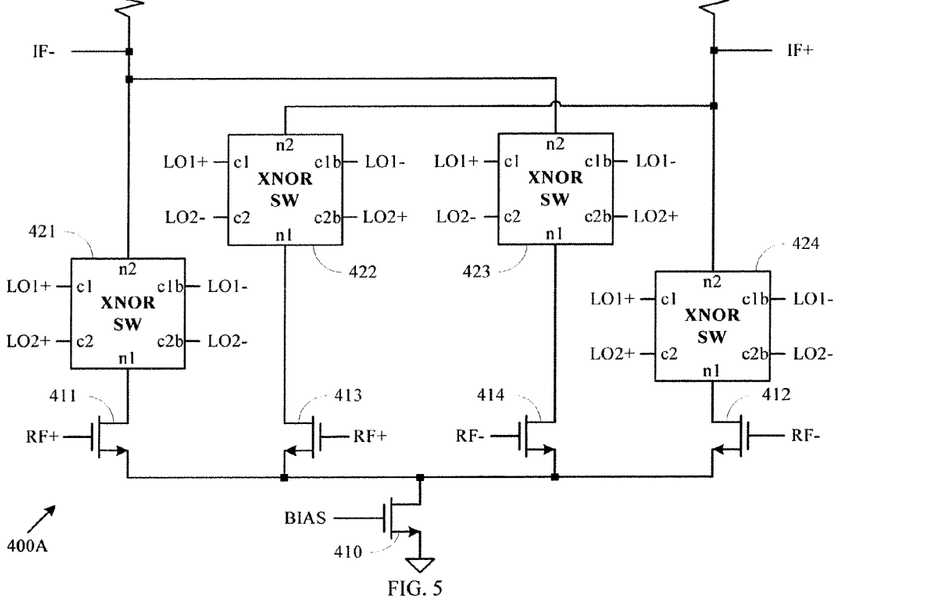
FIG. 5 shows an embodiment alternative to the mixer of FIG. 4.

In an alternative embodiment of an active, doubly balanced dual-LO mixer 400A depicted in FIG. 5, each XNOR-SW circuit is connected to a separate MOSFET. Dual-LO mixer 400A of FIG. 5 is exactly the same as dual-LO mixer 400 of FIG. 4 except that one uses an additional MOSFET 413, whose gate is connected to RF+ and whose drain is connected to XNOR-SW 422, and also an additional MOSFET 414, whose gate is connected to RF− and whose drain is connected to XNOR-SW 423. All four MOSFET 411-412 are connected at their sources. It is obvious to those of ordinary skill in the art that the circuit 400A of FIG. 5 accomplishes exactly the same function as the circuit 400 of FIG. 4, given that at any time one and only one of XNOR-SW 421 and 422 is turned on, and also at any time one and only one of XNOR-SW 423 and 424 is turned on.

Figure 6:
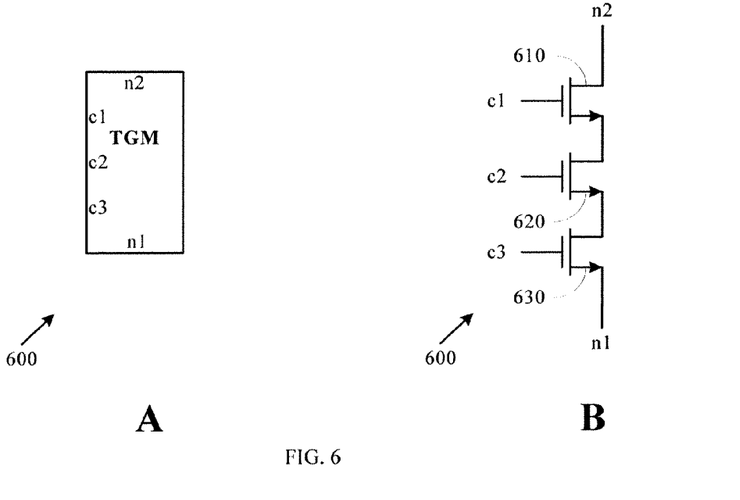
FIG. 6 shows a symbol (in A) and an exemplary circuit embodiment (in B) of a triple gate mixing circuit.
Figure 7:
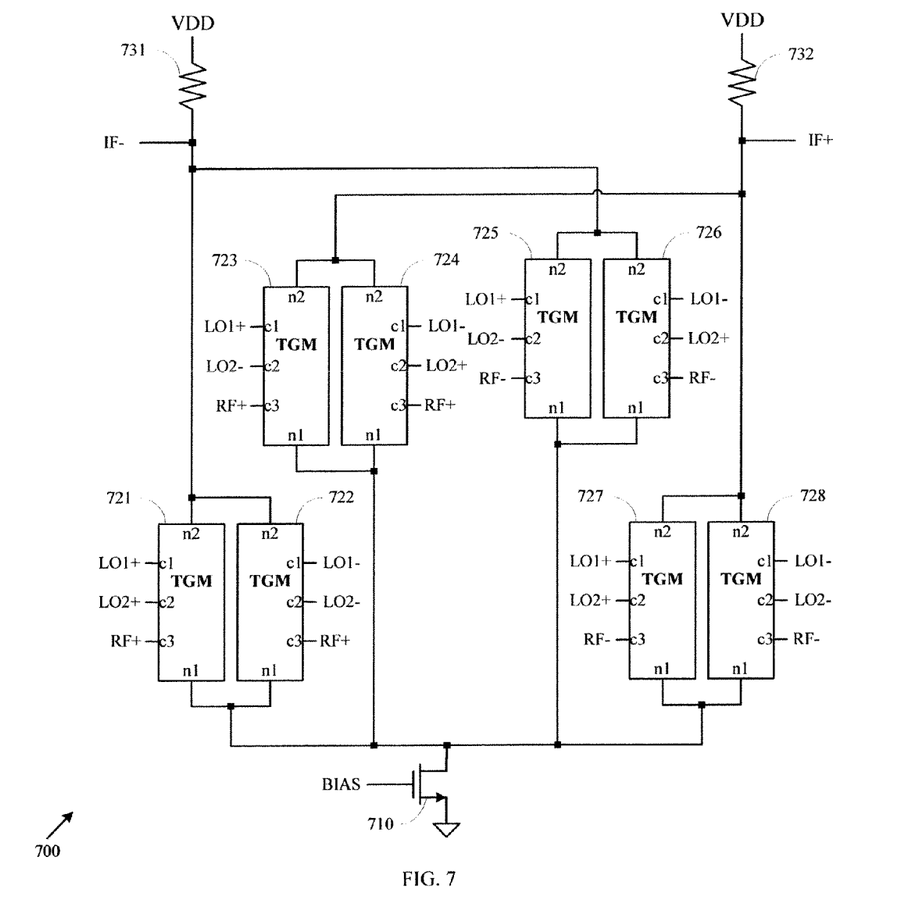
FIG. 7 shows an active doubly balanced dual-LO mixer using eight triple gate mixing circuits.

In a yet alternative embodiment, a triple gate mixing circuit is used. As shown in FIG. 6A, a triple-gate mixing (TGM) circuit 600 has five terminals: n1, n2, c1, c2, and c3. Among them, n1 is a terminal for connecting to a first circuit node, n2 is a terminal for connecting to a second circuit node, c1 is a terminal for connecting to a first logical signal, c2 is a terminal for connecting to a second logical signal, and c3 is a terminal for connecting to a continuous-time signal to be received (in a receiver) or to be transmitted (in a transmitter). Both the first logical signal and the second logical signal are used to control a respective switch within the mixing circuit 600, while the continuous-time signal is used as an input signal for an amplification circuit within the mixer circuit 600. FIG. 6B shows a example of a circuit embodiment for mixer circuit 600, the circuit comprising: a first MOSFET 610, acting as a first switch controlled by the first logical signal, a second MOSFET 620, acting as a second switch controlled by the second logical signal, and a third MOSFET 630, acting as an amplification circuit receiving the continuous-time signal as its input. An active doubly balanced mixer 700 based on TGM is shown in FIG. 7. Here, mixer 700 comprises a MOSFET 710 used to provide a biasing for eight TGM circuits, labeled 721-728, and a resistor pair 731 and 732 used as a differential load for generating the differential output signal IF+/−. Each TGM circuit has its n1 terminal connected to the drain of MOSFET 710, its n2 terminal connected to either IF+ or IF−, its c1 terminal connected to either LO1+ or LO1−, its c2 terminal connected to either LO2+ or LO2−, and its c3 terminal connected to either RF+ or RF−. When LO1+ and LO2+ are both logically high, RF+ is amplified and connected through TGM 721 to IF−, while RF− is amplified and connected through TGM 727 to IF+. When LO1+ and LO2+ are both logically low, RF+ is amplified and connected through TGM 722 to IF−, while RF− is amplified and connected through TGM 728 to IF+. When LO1+ is logically high and LO2+ is logically low, RF+ is amplified and connected through TGM 723 to IF+, while RF− is amplified and connected through TGM 725 to IF−. When LO1+ is logically low and LO2+ is logically high, RF+ is amplified and connected through TGM 724 to IF+, while RF− is amplified and connected through TGM 726 to IF−.

Still refer to FIG. 7. In an alternative embodiment, the biasing MOSFET 710 is removed and the n1 terminal is connected to ground for all eight TGM 721-728.

Still refer to FIG. 7. In an alternative embodiment, a MOSFET pair replaces resistor pair 731 and 732.

In another embodiment suitable for a transmitter application, the roles of IF+/− and RF+/− are exchanged for aforementioned embodiments. That is, IF+/−(instead of RF+/−) is received as a differential input signal for either a passive or active mixer, while a differential output signal (e.g. at a load comprising a resistor pair) is connected to RF+/−(instead of IF+/−)

Figure 8:
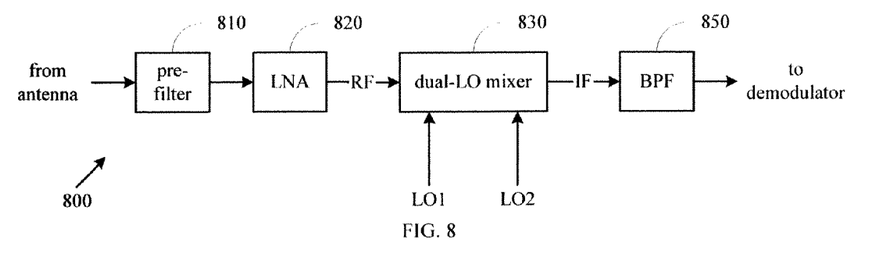
FIG. 8 shows a receiver using a dual-LO mixer to convert a RF signal into an IF signal.

A receiver 800 using a dual-LO mixer is illustrated in FIG. 8. In receiver 800, a wide-band RF signal is received from an antenna, then filtered by a pre-filter 810, then amplified by a LNA (low-noise amplifier) 820, then converted to a IF (intermediate frequency) signal by a dual-LO mixer 830 using two LO signals LO1 and LO2, and then filtered by a BPF (band-pass filter) 850, resulting in a narrow band signal to be further processed by a subsequent demodulator. Due to using only one mixer circuit, tuner 800 thus performs better than the prior art tuner circuit 100 of FIG. 1. In an embodiment, pre-filter 810 is removed. In an embodiment, a filter is inserted between LNA 820 and mixer 830. In an embodiment, the gain of LNA 820 is adjustable. In an embodiment, mixer 830 uses a plurality of XNOR-SW circuits, each of which is turned on or turned off depending a logical relationship between a logical value of LO 1 and a logical value of LO2. In an embodiment, mixer 830 is a passive doubly balanced dual-LO mixer. In an embodiment, mixer 830 is an active doubly balanced dual-LO mixer. In an embodiment, mixer 830 uses a plurality of triple gate mixing circuits. In an embodiment, receiver 800 is a TV tuner.

Figure 9:
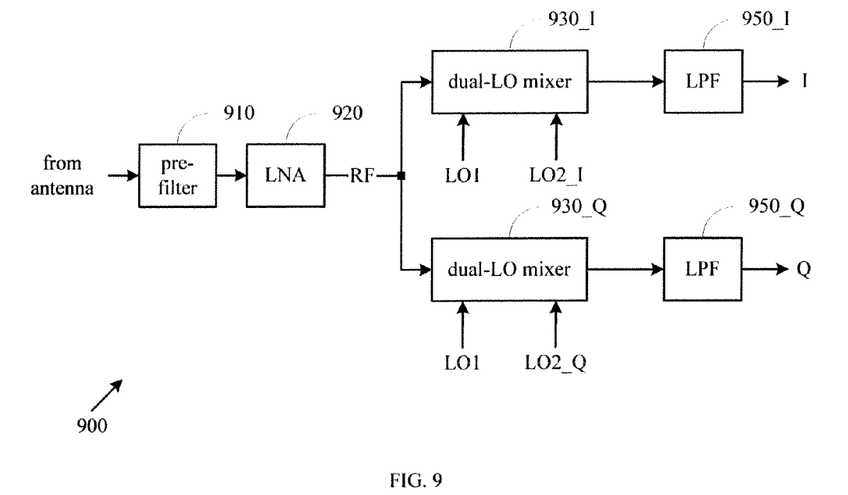
FIG. 9 shows a receiver using two dual-LO mixers to convert a RF signal into two baseband signals.

In an alternative embodiment, a receiver 900 using two dual-LO mixers is illustrated in FIG. 9. In receiver 900, a wide-band RF signal is received from an antenna, then filtered by a pre-filter 910, then amplified by a LNA (low-noise amplifier) 920, and then converted into two baseband signals using two conversion paths: in an in-phase (I) path, the RF signal from LNA 920 is converted into a first baseband signal I using a first dual-LO mixer 930_I followed by a first LPF (low pass filter) 950_I; and in a quadrature (Q) path, the RF signal from LNA 920 is converted into a second baseband signal Q using a second dual-LO mixer 930_Q followed by a second LPF 950_Q. The first dual-LO mixer 930_I receives two LO signals: LO1 and LO2_I. The second dual-LO mixer 930_Q receives two LO signals: LO1 and LO2_Q. LO2_I and LO2_Q are of the same frequency but 90 degrees out of phase. In an embodiment, pre-filter 910 is removed. In an embodiment, a filter is inserted between LNA 920 and mixers 930_I and 930_Q. In an embodiment, the gain of LNA 920 is adjustable. In an embodiment, mixers 930_I and 930_Q use a plurality of XNOR-SW circuits, each of which is turned on or turned off depending a logical relationship between a logical value of LO1 and a logical value of either LO2_I or LO2_Q. In an embodiment, mixers 930_I and 930_Q are both passive doubly balanced dual-LO mixers. In an embodiment, mixers 930_I and 930_Q are both active doubly balanced dual-LO mixers. In an embodiment, mixers 930_I and 930_Q both use a plurality of triple gate mixing circuits. In an embodiment, receiver 900 is a TV tuner.

Figure 10:
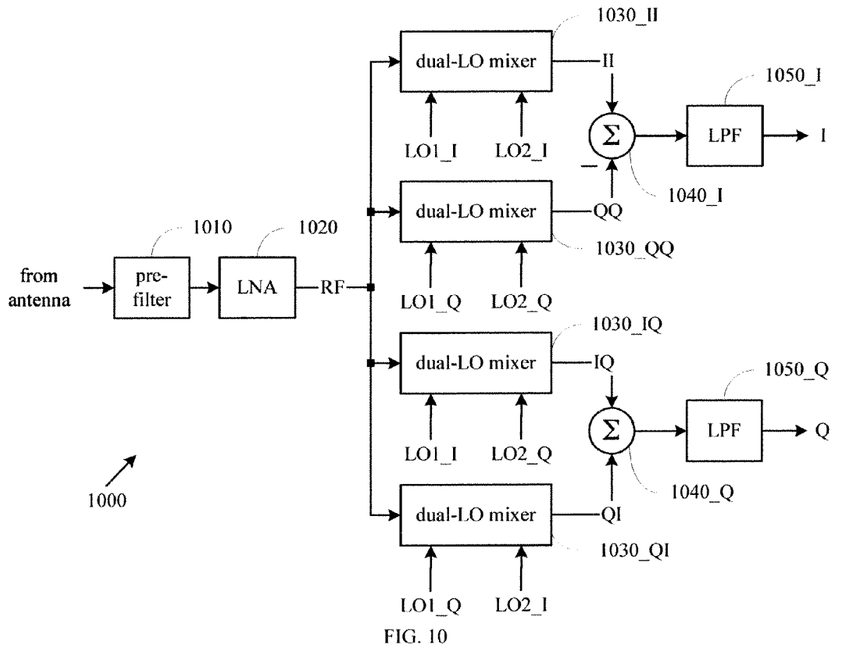
FIG. 10 shows a receiver using four dual-LO mixers to convert a RF signal into two baseband signals.

In a further embodiment, a receiver 1000 using four dual-LO mixers is illustrated in FIG. 10. In receiver 1000, a wideband RF signal is received from an antenna, then filtered by a pre-filter 1010, then amplified by a LNA (low-noise amplifier) 1020, and then down-converted into four baseband signals using four conversion paths: in a first path, the RF signal from LNA 1020 is converted into a first baseband signal II using a first dual-LO mixer 1030_II; in a second path, the RF signal from LNA 1020 is converted into a second baseband signal QQ using a second dual-LO mixer 1030_QQ; in a third path, the RF signal from LNA 1020 is converted into a third baseband signal IQ using a third dual-LO mixer 1030_IQ; in a fourth path, the RF signal from LNA 1020 is converted into a fourth baseband signal QI using a fourth dual-LO mixer 1030_QI. The first dual-LO mixer 1030_II receives two LO signals: LO1_I and LO2_I. The second dual-LO mixer 1030_QQ receives two LO signals: LO1_Q and LO2_Q. The third dual-LO mixer 1030_IQ receives two LO signals: LO1_I and LO2_Q. The fourth dual-LO mixer 1030_QI receives two LO signals: LO1_Q and LO2_I. LO1_I and LO1_Q are of the same frequency but 90 degrees out of phase. Also, LO2_I and LO2_Q are of the same frequency but 90 degrees out of phase. In an embodiment, pre-filter 1010 is removed. In an embodiment, a filter is inserted between LNA 1020 and mixers 1030_II, 1030_QQ, 1030_IQ, and 1030_QI. In an embodiment, the gain of LNA 1020 is adjustable. In an embodiment, mixers 1030_II 1030_QQ, 1030_IQ, and 1030_QI use a plurality of XNOR-SW circuits, each of which is turned on or turned off depending a logical relationship between a logical value of either LO1_I or LO1_Q and a logical value of either LO2_I or LO2_Q. Baseband signals II and QQ are combined in a first summing circuit 1040_I and then filtered by a first LPF 1050_I, resulting in an in-phase baseband signal I. Baseband signals IQ and QI are combined in a second summing circuit 1040_Q and then filtered by a second LPF 1050_Q, resulting in a quadrature baseband signal Q. In an embodiment, mixers 1030_II, 1030_QQ, 1030_IQ, and 1030_QI are all passive doubly balanced dual-LO mixers. In an embodiment, mixers 1030_II, 1030_QQ, 1030_IQ, and 1030_QI are all active doubly balanced dual-LO mixers. In an embodiment, mixers 1030_II, 1030_QQ, 1030_IQ, and 1030_QI all use a plurality of triple gate mixing circuits. In an embodiment, summing circuit 1040_I and LPF 1050_I are combined as one circuit, and also summing circuit 1040_Q and LPF 1050_Q are combined as one circuit. In an embodiment, receiver 1000 is a TV tuner.

Figure 11:
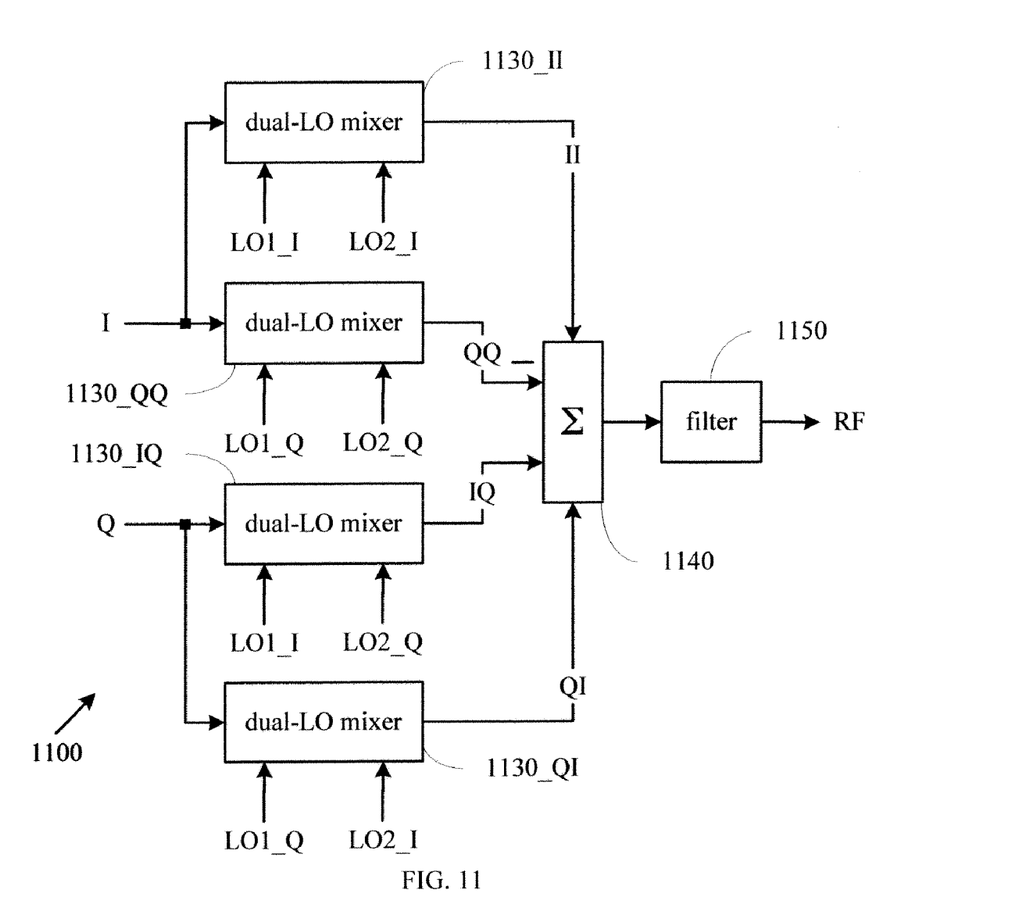
FIG. 11 shows a transmitter using four dual-LO mixers to convert two baseband signals into a RF signal.

In a further embodiment, a transmitter 1100 using four dual-LO mixers is illustrated in FIG. 11. In transmitter 1100, a pair of baseband signals I and Q are up-converted using four conversion paths: in a first path, the I signal is converted into a first RF signal II using a first dual-LO mixer 1130_II; in a second path, the I signal is converted into a second RF signal QQ using a second dual-LO mixer 1130_QQ; in a third path, the Q signal is converted into a third RF signal IQ using a third dual-LO mixer 1130_IQ; and in a fourth path, the Q signal is converted into a fourth RF signal QI using a fourth dual-LO mixer 1130_QI. The first dual-LO mixer 1130_II receives two LO signals: LO_I and LO2_I. The second dual-LO mixer 1130_QQ receives two LO signals: LO1_Q and LO2_Q. The third dual-LO mixer 1130_IQ receives two LO signals: LO1_I and LO2_Q. The fourth dual-LO mixer 1130_QI receives two LO signals: LO1_Q and LO2_I. LO1_I and LO1_Q are of the same frequency but 90 degrees out of phase. Also, LO2_I and LO2_Q are of the same frequency but 90 degrees out of phase. The four RF signals II, QQ, IQ, and QI are combined in a summing circuit 1140 and then filtered by a filter 1150, resulting in an output RF signal. In an embodiment, filter 1150 is removed. In an embodiment, an amplifier is inserted either before filter 1150 or after filter 1150. In an embodiment, mixers 1130_II, 1130_QQ, 1130_IQ, and 1130_QI use a plurality of XNOR-SW circuits, each of which is turned on or turned off depending a logical relationship between a logical value of either LO1_I or LO1_Q and a logical value of either LO2_I or LO2_Q. In an embodiment, one of mixers 1130_II and 1130_QQ and its corresponding conversion path are removed, and also one of mixers 1130_IQ and 1130_QI and its corresponding conversion path are removed. In an embodiment, baseband signal I is replaced by an IF signal and both the third and fourth conversion paths are removed. In an embodiment, baseband signal I is replaced by an IF signal, one of the first and the second conversion paths is removed, and both the third and fourth conversion paths are removed.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A receiver comprising:
   a first mixer for receiving a first reference signal of a first reference frequency and a second reference signal of a second reference frequency and converting an input RF (radio frequency) signal into a first conversion signal using the first reference signal of the first reference frequency and the second reference signal of the second reference frequency, wherein the converting is performed by a switch circuit including at least one switch that conditionally connects two circuit nodes depending on an exclusive NOR operation on the first reference signal and the second reference signal;
   a second mixer for receiving a third reference signal of the first reference frequency and a fourth reference signal of the second reference frequency and converting the input RF signal into a second conversion signal using the third reference signal of the first reference frequency and the fourth reference signal of the second reference frequency, wherein the converting is performed by a switch circuit including at least one switch that conditionally connects two circuit nodes depending on an exclusive NOR operation on the third reference signal and the fourth reference signal;
   a third mixer for receiving the first reference signal of the first reference frequency and the fourth reference signal of the second reference frequency and converting the input RF signal into a third conversion signal using the first reference signal of the first reference frequency and the fourth reference signal of the second reference frequency, wherein the converting is performed by a switch circuit including at least one switch that conditionally connects two circuit nodes depending on an exclusive NOR operation on the first reference signal and the fourth reference signal;

a fourth mixer for receiving the third reference signal of the first reference frequency and the second reference signal of the second reference frequency and converting the input RF signal into a fourth conversion signal using the third reference signal of the first reference frequency and the second reference signal of the second reference frequency, wherein the converting is performed by a switch circuit including at least one switch that conditionally connects two circuit nodes depending on an exclusive NOR operation on the third reference signal and the second reference signal;

a first summing circuit for summing by addition the first and the second conversion signals to generate a first output signal; and a second summing circuit for summing by addition the third and the fourth conversion signals to generate a second output signal.

2. The receiver of claim 1, wherein the phase difference between the first reference signal and the third reference signal is approximately 90 degrees and also the phase difference between the second reference signal and the fourth reference signal is approximately 90 degrees.

3. The receiver of claim 2, wherein the frequency difference between each of said conversion signals and the input RF signal is a sum or a difference of the first reference frequency and the second reference frequency.

* * * * *